US006252445B1

(12) United States Patent
Eidson

(10) Patent No.: US 6,252,445 B1
(45) **Date of Patent: *Jun. 26, 2001**

(54) METHOD AND APPARATUS FOR EXTENDING A RESOLUTION OF A CLOCK

(75) Inventor: John C. Eidson, Palo Alto, CA (US)

(73) Assignee: Agilent Technologies, Inc., Palo Alto, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/281,865

(22) Filed: Mar. 31, 1999

(51) Int. Cl.[7] .................................................. H03K 7/08

(52) U.S. Cl. .......................... 327/172; 327/174; 327/261

(58) Field of Search .................................. 327/172, 147, 327/175, 141, 263, 261, 277, 284

(56) References Cited

U.S. PATENT DOCUMENTS 5,552,878 * 9/1996 Dillard ................................ 342/135
5,568,076 * 10/1996 Pella et al. .......................... 327/174

* cited by examiner

*Primary Examiner*—Dinh T. Le

(57) ABSTRACT

A method and apparatus for extending a resolution of a clock in which the resolution is limited by a period of an oscillator in the clock. The present method and apparatus employs delays which are adapted to the period of the clock and which enable the determination of corrections to be applied to the timing function performed by the clock. The corrections effectively extend the resolution of the clock without increasing the frequency of the oscillator.

10 Claims, 3 Drawing Sheets

METHOD AND APPARATUS FOR EXTENDING A RESOLUTION OF A CLOCK

BACKGROUND OF THE INVENTION

1. Field of Invention

The present invention pertains to the field of digital clocks. More particularly, this invention relates to a method and apparatus for extending a resolution of a clock.

2. Art Background

A wide variety of systems commonly include digital clocks. Such clocks may be used for a wide variety of timing functions in a system. One example of a timing function is to measure a time at which an event in the system occurs. Another example of a timing function is to synchronize or "trigger" an occurrence of an event at a particular time. The nature of the events depends on the particulars of the system.

In a control system, for example, the act of obtaining a data sample from a sensor is an event as is the act of applying a control value to an actuator. A digital clock may be used to measure the time at which the data sample is obtained from the sensor. In addition, a digital clock may be used to trigger the application of the control value to the actuator at a particular time.

A typical digital clock includes an oscillator and circuitry that generates digital time values in response to the oscillator. The circuitry that generates digital time values may be, for example, a counter that generates an updated time value every period or half period of the oscillator. Typically, the resolution of such a digital clock is limited by the frequency of its oscillator. For example, an oscillator that runs at 1 megahertz has a period of 1 microsecond and can generate an updated time value every 0.5 microseconds, thereby yielding a resolution of 0.5 microseconds. Such a digital clock could not reliably distinguish events that occur within 0.5 microseconds of each other and could not reliably synchronize events that are to occur within 0.5 microseconds of each other. This may limit the overall performance of the system.

One prior method of increasing the resolution of a digital clock is to increase the frequency of its oscillator. Unfortunately, an increased oscillator frequency usually increases power consumption. In addition, higher oscillator frequencies usually complicate the design of circuitry for the digital clock. Moreover, an oscillator is commonly shared with other components of a system, such as a processor, which may not be amenable to a higher oscillator frequency.

SUMMARY OF THE INVENTION

A method and apparatus is disclosed for extending a resolution of a clock in which the resolution is limited by a period of an oscillator in the clock. The present method and apparatus employs delays which are adapted to the period of the clock and which enable the determination of corrections to be applied to a timing function performed by the clock. The corrections effectively extend the resolution of the clock without increasing the frequency of the oscillator.

The present teachings may be applied to a clock in which the timing function is the measurement of a time at which an event occurs. For this timing function, a time value is obtained from the clock in response to a trigger signal for the event and then a series of values are obtained from the clock such that the time value and the series of values are delayed in time by a predetermined sub-interval of the period. A correction value to be applied to the time value is determined by detecting a pattern in the series of values.

The present teachings may also be used to extend the accuracy of a clock in which the timing function is the synchronization of signal timing. For this timing function, a trigger signal is generated when a time value from the clock equals a set of most significant bits of a trigger time value which is associated with a signal being synchronized. A set of delayed trigger signals are generated such that the trigger signal and the delayed trigger signals are spaced in time by a predetermined sub-interval of the period. A corrected trigger signal with extended resolution is selected from among the trigger signal and the delayed trigger signals in response to a set of least significant bits of the trigger time value.

Other features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which.

DETAILED DESCRIPTION

Figure 1:
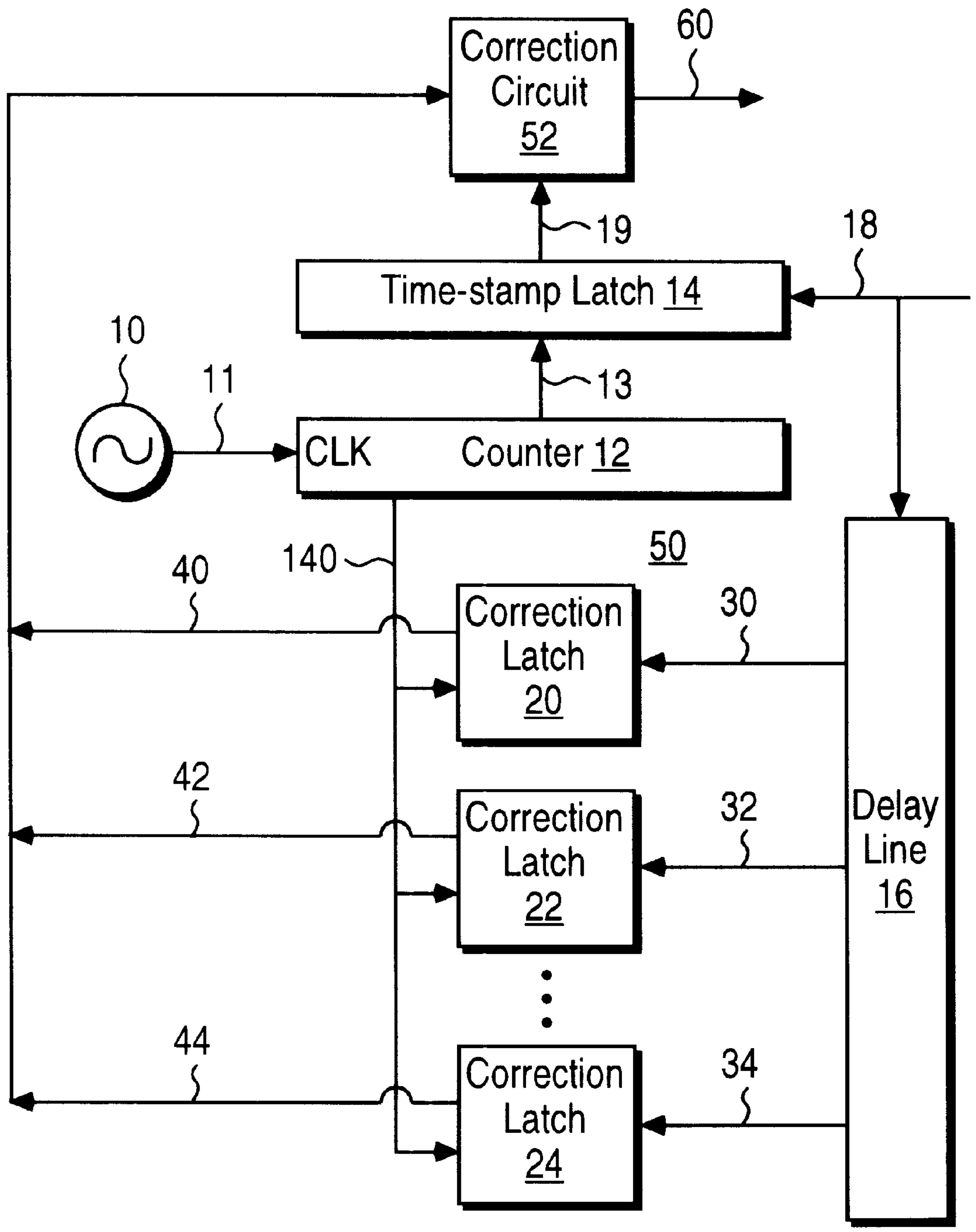
FIG. 1 illustrates a circuit that embodies a method and apparatus for extending the resolution of a clock according to the present teachings.

FIG. 1 illustrates a circuit 50 that embodies a method and apparatus for extending a resolution of a clock according to the present teachings. The circuit 50 generates a time-stamp 60 that indicates a time at which an event occurs. The occurrence of the event is indicated by a trigger signal 18. The digital clock portion of the circuit 50 includes an oscillator 10 and a counter 12.

The oscillator 10 generates an oscillator signal 11. The oscillator signal 11 provides a clock input (CLK) to the counter 12. The counter 12 generates updates of a time value 13 in response to the oscillator signal 11. The time value 13 provides an input to a time-stamp latch 14. The time-stamp latch 14 captures the time value 13 in response to an edge of the trigger signal 18.

The time value 13 has a resolution which is limited by a rate at which the oscillator signal 11 causes the counter 12 to increment. The counter 12 may increment the time value 13 once per period of the oscillator signal 11. Alternatively, the counter 12 may increment the time value 13 twice per period of the oscillator signal 11, i.e. at each zero-crossing of the oscillator signal 11.

The circuit 50 includes a delay line 16 and a set of correction latches 20–24 that enable an extended resolution in the time-stamp 60 over the resolution of the time-value 13. In the following description, P is a time interval that represents the resolution of the time value 13 and n is the number of fractions of P of extended resolution that is yielded by the present teachings. The time interval P is substantially equal to the period of the oscillator signal 11 if the counter 12 increments once per period of the oscillator signal 11. The time interval P is equal to one-half of the period of the oscillator signal 11 if the counter 12 increments on zero-crossings of the oscillator signal 11.

The delay line 16 generates a set of tap signals 30–34 by successively delaying the trigger signal 18. The number of the tap signals 30–34 is equal to n−1. The tap signal 30 is the trigger signal 18 delayed by P/n. The tap signal 32 is the trigger signal 18 delayed by 2P/n and the tap signal 34 is the trigger signal 18 delayed by (n−1)P/n. The trigger signal 18 together with the tap signals 30–34 subdivide the period P into a set of n uniform sub-intervals. In one embodiment, n equals 4 and the taps 30–34 are the trigger signal 18 delayed by P/4, P/2 and 3P/4, respectively. The delay line 16 may be implemented as a lump circuit, a series of one-shot gates, or a propagation-based delay line to name a few examples.

The correction latches 20–24 capture a value 140 in response to the tap signals 30–34, respectively. The value 140 is the least significant few bits of the time value 13. The number of bits in the value 140 is preselected so that the value 140 will always change on successive updates of the time value 13. In the embodiment shown which employs the counter 12 to generate the time value 13, a single least significant bit of the time value 13 is sufficient for the value 140. In another embodiment in which the time value 13 is generated by an adder or a combination counter/adder, more bits may be needed for the value 140 because the least significant bit of the time value 13 may not change on successive updates.

The correction latch 20 captures the value 140 on an edge of the tap signal 30 that corresponds to the edge of the trigger signal 18 that caused the time-stamp latch 14 to capture the time value 13. Similarly, the correction latch 22 captures the value 140 on an edge of the tap signal 32 and the correction latch 24 captures the value 140 on an edge of the tap signal 34. The number of the correction latches 20–24 is equal to n−1. A latched time value 19 from the time-stamp latch 14 and a set of captured values 40–44 from the correction latches 20–24 are delayed in time with respect to one another by a predetermined sub-interval P/n of the period P.

In one embodiment, a correction circuit 52 determines a correction value to be applied to the latched time value 19. The correction circuit 52 generates the time-stamp 60 in response to the captured values 40–44 and the latched time value 19.

In other embodiments, the corrections performed by the correction circuit 52 may instead be performed in software or firmware. For example, the contents of the time-stamp latch 14 and the correction latches 20–24 may be read by a processor (not shown) which then performs the corrections in accordance with the present teachings.

Figure 2:
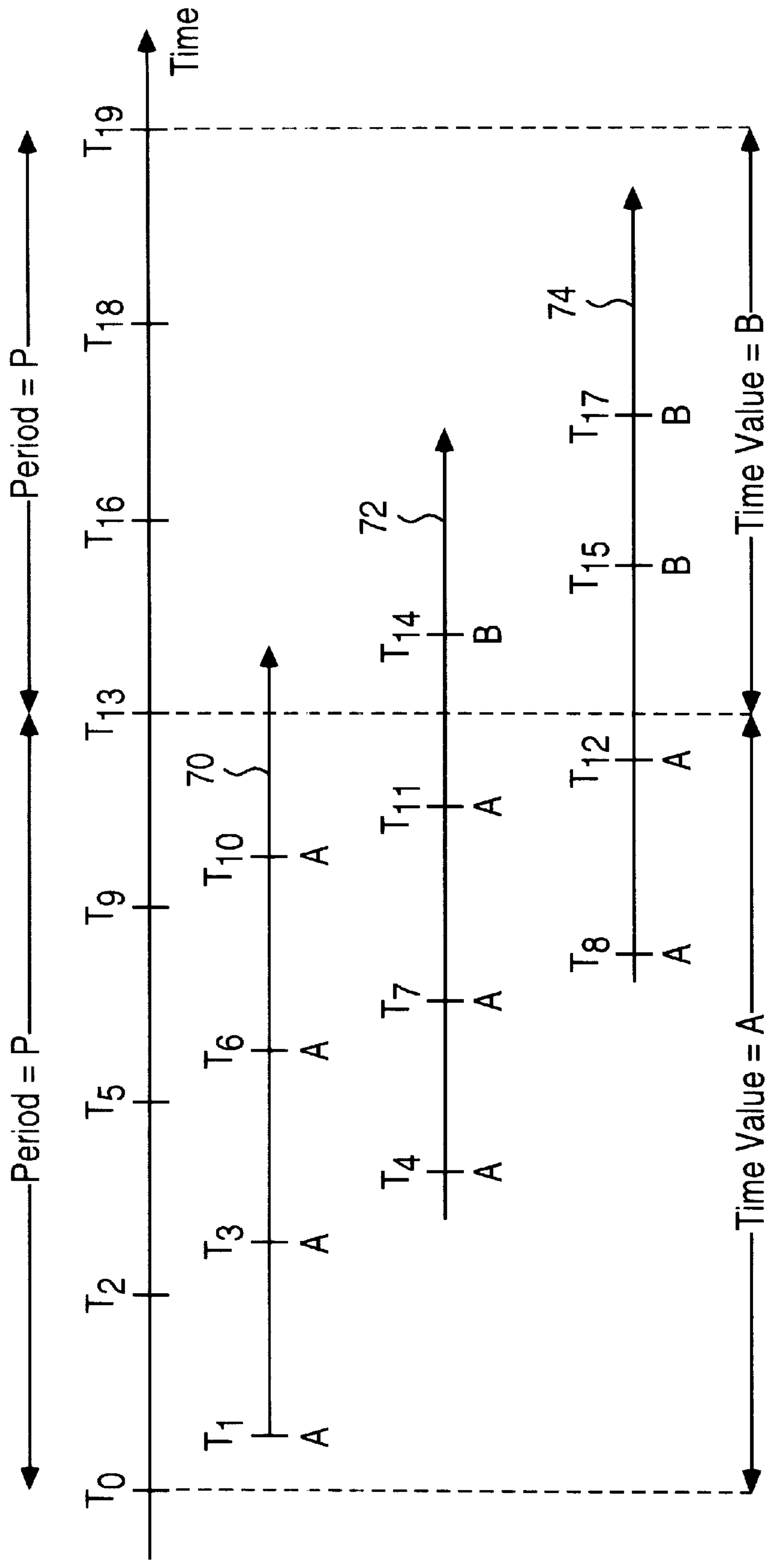
FIG. 2 shows a set of time lines that illustrate the determination of a correction value applied to a time-stamp.

FIG. 2 shows a set of time lines 70–72 that illustrate the functions of the delay line 16 and the correction latches 20–24 and the determination of the correction value applied to the time-stamp 60. In this illustration, P is the period of the oscillator signal 11 and the resolution of the time value 13 and n equals 4.

One period of the oscillator signal 11 occurs between times t0 and t13 and a subsequent period occurs between times t13 and t19. The counter 12 increments at time t0 to a value equal to A and increments at time t13 to a value equal to B. As a consequence, the value 140 equals the least significant few bits of A between times t0 and t13 and equals the least significant few bits of B between times t13 and t19.

The time line 70 represents a case in which the edge of the trigger signal 18 that loads the time-stamp latch 14 occurs at time t1. The delay line 16 successively delays the trigger signal 18 which yields corresponding edges of the tap signals 30–34 at times t3, t6, and t10, respectively. The times t1, t3, t6, and t10 are spaced in time by P/n. In response to an edge of the trigger signal 18 at time t1, the time value 13 which equals A is latched in the time-stamp latch 14. In response to an edge of the tap signal 30 at time t3, the value 140 which equals the least significant few bits of A is latched in the correction latch 20 and is provided to the correction circuit 52. Similarly, the edges of the tap signals 32–34 at times t6 and t10, respectively, latch the least significant few bits of A into the correction latches 22–24, respectively.

The time line 72 represents a case in which the edge of the trigger signal 18 that loads the time-stamp latch 14 occurs at time t4. The delay line 16 successively delays the trigger signal 18 which yields corresponding edges of the tap signals 30–34 at times t7, t11, and t14, respectively. In response to an edge of the trigger signal 18 at time t4, the time value 13 which equals A is latched in the time-stamp latch 14. In response to edges of the tap signals 30–32 at times t7 and t11, respectively, the value 140 which equals the least significant few bits of A is latched in the correction latches 20 and 22, respectively. An edge of the tap signal 34 at time t14 latches the value 140, which at time t14 equals the least significant few bits of B, into the correction latch 24.

The time line 74 represents a case in which the edge of the trigger signal 18 that loads the time-stamp latch 14 occurs at time t8. The delay line 16 yields corresponding edges of the tap signals 30–34 at times t12, t15, and t17, respectively. In response to an edge of the trigger signal 18 at time t8, the time value 13 equal to A is latched in the time-stamp latch 14. In response an edge of the tap signal 30 at time t12, the value 140 which equals the least significant few bits of A is latched in the correction latch 20. Edges of the tap signals 32 and 34 at times t15 and t17, respectively, latch the value 140, which at times t15 and t17 equals the least significant few bits of B, into the correction latches 22 and 24, respectively.

The correction value to be applied to the latched time value 19 is determined in response to the captured values 40–44. The amount of correction applied depends on the pattern of values observed in the captured values 40–44. Each B value held in the correction latches 20–24 yields a P/n correction to be applied.

A pattern of A, A, A in the captured values 40–44 yields a correction of zero and the time-stamp 60 equals the latched time value 19. This corresponds to the example time line 70.

A pattern of A, A, B in the captured values 40–44, respectively, yields a correction of P/n which in this example equals P/4. The latched time value 60 is $t_{latch}$. The time-stamp 60 is equal to $t_{latch}$+P/4. This corresponds to the example time line 72.

A pattern of A, B, B in the captured values 40–44, respectively, yields a correction of 2P/n which in this example equals P/2. The time-stamp 60 is equal to $t_{latch}$+P/2. This corresponds to the example time line 74. Similarly, a pattern of B, B, B in the captured values 40–44 would yield the time-stamp 60 equal to $t_{latch}$+3P/4.

The greater the number of taps in the delay line 16 and corresponding correction latches 20–24, i.e. the higher the n, the greater the extended resolution in the time-stamp 60 that may be realized. It is preferable that the stability of the oscillator 10 be greater than or equal to P/n to realize the full benefits of the teachings herein.

Figure 3:
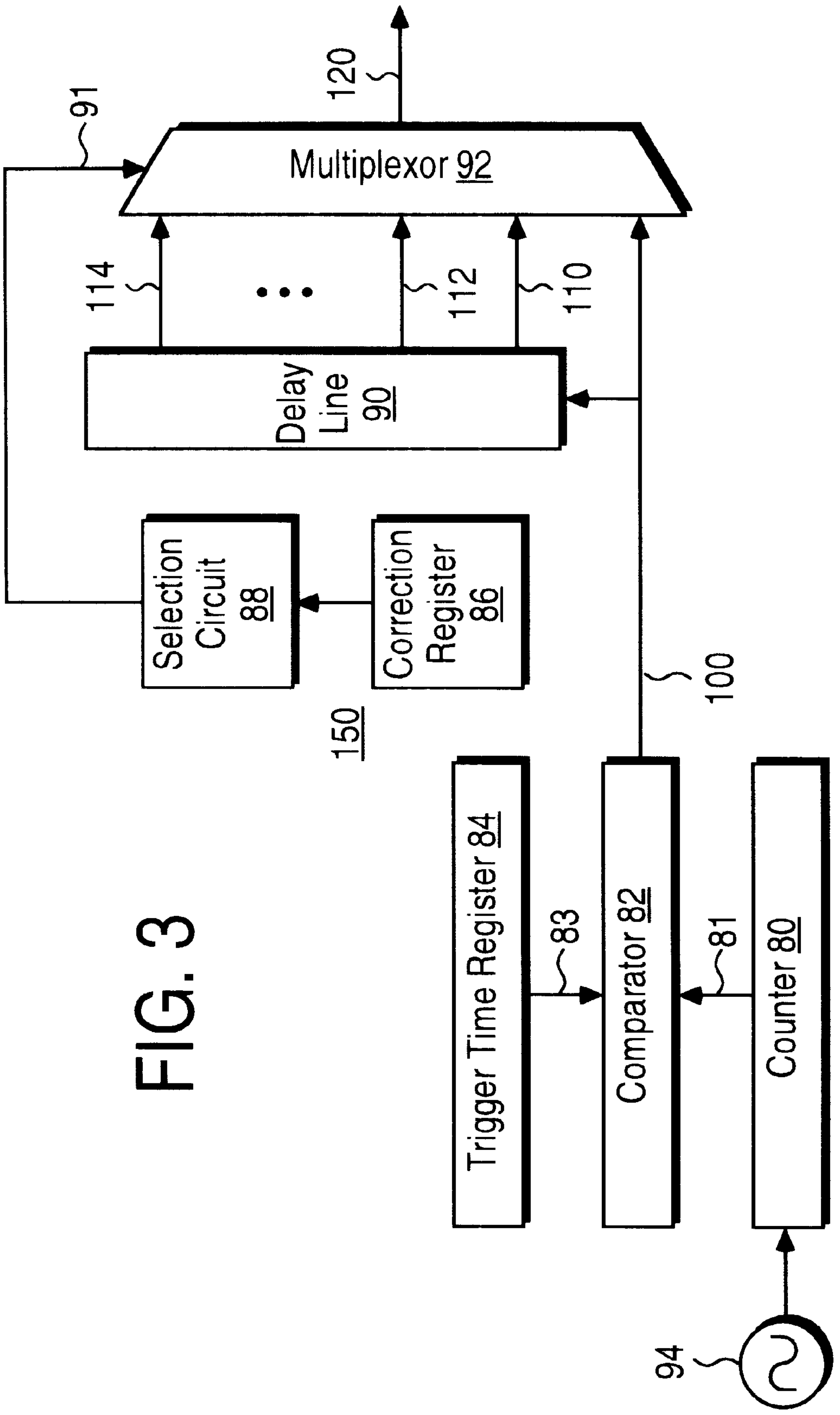
FIG. 3 illustrates another circuit that embodies a method and apparatus for extending the resolution of a clock according to the present teachings.

FIG. 3 illustrates a circuit 150 that embodies a method and apparatus for extending the resolution of a clock according to the present teachings. The circuit 150 synchronizes signal timing by generating a trigger signal 120 at a trigger time. The most significant bits of the trigger time are stored in a trigger time register 84 and the remaining least significant bits are stored in a correction register 86.

The circuit 150 includes a comparator 82 that generates a trigger signal 100 when a time value 81 generated by a digital clock comprising an oscillator 94 and a counter 80 equals a portion 83 of the trigger time which is stored in the trigger time register 84. The counter 80 generates the time value 81 with a resolution substantially equal to the period or half-period P of the oscillator 94 in a manner similar to that previously described. As a consequence, the resolution of the an edge of the trigger signal 100 is limited to the resolution P.

The circuit 150 includes a delay line 90, a multiplexor 92, and a selection circuit 88 that together yield extended resolution in the trigger signal 120 over the resolution of the trigger signal 100. The delay line 90 generates a set of n−1 tap signals 110–114 by successively delaying the trigger signal 100. The tap signal 110 is the trigger signal 100 delayed by P/n. The tap signal 112 is the trigger signal 100 delayed by 2P/n and the tap signal 114 is the trigger signal 100 delayed by (n−1)P/n.

The bits in the correction register 86 provide a set of extended resolution bits that determine which of the trigger signal 100 or the tap signals 110–114 is to be the trigger signal 120. A selection circuit 88 decodes the bits from the correction register 86 to provide a set of control signals 91 to the multiplexor 92 to select either the trigger signal 100 or one of the tap signals 110–114. In an embodiment in which n=4, a value of 0 in the control register 86 causes selection of the trigger signal 100 as the trigger signal 120. A value of 1 in the control register 86 causes selection of the tap signal 110, and values of 2 and 3 in the control register 86 cause selection of the tap signals 112 and 114, respectively. The selected one of the trigger signal 100 or the tap signals 110–114 may be used to trigger an event in a system.

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. A circuit for generating a time-stamp for a trigger signal, comprising:

clock circuit including an oscillator that generates an oscillator signal and a circuit that generates updates of a time value in response to the oscillator signal;

latch circuit coupled to receive the time value from the clock circuit, the latch circuit obtaining a latched time value by latching the time value in response to the trigger signal;

delay line coupled to receive the trigger signal, the delay line generating a set of tap signals by successively delaying the trigger signal such that the trigger signal and the tap signals are spaced in time by a set of predetermined sub-intervals of a period of the oscillator signal;

a set of correction latches corresponding to the tap signals, each correction latch coupled to receive a portion of the time value from the counter, each correction latch obtaining a captured time value by latching the portion of the time value in response to the corresponding tap signal;

means for determining a correction value by examining a pattern in the time value and the captured time values;

means for applying the correction value to the latched time value.

2. The circuit of claim 1, wherein the portion of the time value comprises a set of least significant bits of the time value.

3. The circuit of claim 1, wherein the circuit that generates updates of the time value comprises a counter.

4. The circuit of claim 1, wherein the circuit that generates updates of the time value comprises an adder.

5. A method for generating a time-stamp for a trigger signal, comprising the steps of:

generating updates of a time value in response to an oscillator signal;

obtaining a latched time value by latching the time value in response to the trigger signal;

generating a set of tap signals by successively delaying the trigger signal such that the trigger signal and the tap signals are spaced in time by a set of predetermined sub-intervals of a period of the oscillator signal;

obtaining a set of captured time value by latching a portion of the time value in response to the tap signals;

determining a correction value by examining a pattern in the time value and the captured time values;

applying the correction value to the latched time value.

6. The method of claim 5, wherein the step of latching a portion of the time value comprises the step of latching a set of least significant bits of the time value.

7. A circuit for generating a trigger signal, comprising:

clock circuit including an oscillator that generates an oscillator signal and a circuit that generates updates of a time value in response to the oscillator signal;

comparator circuit coupled to receive the time value from the clock circuit, the comparator circuit generating a first trigger signal when the time value equals a most significant portion of a trigger time for the trigger signal;

delay line coupled to receive the first trigger signal, the delay line generating a set of delayed trigger signals in response to the first trigger signal such that the first trigger signal and the delayed trigger signals are spaced in time by a predetermined sub-interval of a period of the oscillator signal;

means for selecting the trigger signal from among the first trigger signal and the delayed trigger signals in response to a least significant portion of the trigger time.

8. The circuit of claim 7, wherein the circuit that generates updates of the time value comprises a counter.

9. The circuit of claim 7, wherein the circuit that generates updates of the time value comprises an adder.

10. A method for generating a trigger signal, comprising the steps of:

generating updates of a time value in response to an oscillator signal;

generating a first trigger signal when the time value equals a most significant portion of a trigger time for the trigger signal;

generating a set of delayed trigger signals in response to the first trigger signal such that the first trigger signal and the delayed trigger signals are spaced in time by a predetermined sub-interval of a period of the oscillator signal;

selecting the trigger signal from among the first trigger signal and the delayed trigger signals in response to a least significant portion of the trigger time.

* * * * *